(12) United States Patent
Pontiga et al.

(10) Patent No.: US 12,080,301 B2
(45) Date of Patent: Sep. 3, 2024

(54) UTILIZING INAUDIBLE ULTRASONIC FREQUENCIES TO EMBED ADDITIONAL AUDIO ASSET CHANNELS WITHIN EXISTING AUDIO CHANNELS

(71) Applicant: Sony Interactive Entertainment Inc., Tokyo (JP)

(72) Inventors: Christopher M. Pontiga, San Mateo, CA (US); Celeste Bean, San Mateo, CA (US); Arthur Kwun, San Mateo, CA (US)

(73) Assignee: Sony Interactive Entertainment Inc., Tokyo (JP)

( * ) Notice: Subject to any disclaimer, the term of this patent is extended or adjusted under 35 U.S.C. 154(b) by 113 days.

(21) Appl. No.: 18/056,132

(22) Filed: Nov. 16, 2022

(65) Prior Publication Data

US 2024/0161759 A1  May 16, 2024

(51) Int. Cl.
*G06F 30/20* (2020.01)
*G08B 6/00* (2006.01)
*G10L 19/018* (2013.01)

(52) U.S. Cl.
CPC ............ *G10L 19/018* (2013.01); *G06F 30/20* (2020.01); *G08B 6/00* (2013.01)

(58) Field of Classification Search
CPC .......... G06F 30/20; G10L 19/018; G08B 6/00
USPC ............................................................. 703/20
See application file for complete search history.

(56) References Cited

U.S. PATENT DOCUMENTS

| | | | |
|---|---|---|---|
| 10,643,593 B1 * | 5/2020 | Kolen | G10H 1/40 |
| 2014/0357261 A1 | 12/2014 | Chiu et al. | |
| 2017/0316718 A1 * | 11/2017 | Hughes | H04M 19/047 |
| 2019/0278375 A1 * | 9/2019 | Da Costa | G06F 3/016 |
| 2022/0069922 A1 * | 3/2022 | Koksal | H04R 1/22 |

OTHER PUBLICATIONS

"International Search Report and Written Opinion", dated Feb. 12, 2024, from the counterpart PCT application PCT/US/23/077982.

* cited by examiner

*Primary Examiner* — Andre Pierre Louis
(74) *Attorney, Agent, or Firm* — John L. Rogitz; John M. Rogitz

(57) ABSTRACT

Computer game transmitters can shift frequencies of game assets such as audio or haptic assets to the ultrasonic range and then mix the assets with game audio, transmitting the mix. Receivers then separate the audio from the audible band to play the audio and downmix the assets for play thereof. The frequencies of the assets can be companded prior to transmission.

20 Claims, 10 Drawing Sheets

UTILIZING INAUDIBLE ULTRASONIC FREQUENCIES TO EMBED ADDITIONAL AUDIO ASSET CHANNELS WITHIN EXISTING AUDIO CHANNELS

FIELD

The present application relates generally to using inaudible ultrasonic frequencies to embed additional audio asset channels within existing audio channels.

BACKGROUND

As understood herein, audio bandwidth available from computer simulation audio such as computer game audio may be comparatively large, e.g., 24 kHz from a 48 kHz audio sampling rate.

SUMMARY

As further understood herein, human hearing is generally limited up to around 12 kHz or in some circumstances up to 14 kHz in younger individuals. Present principles recognize that this leaves 10-12 kHz of bandwidth available in the ultrasonic frequencies that is otherwise unused and not audible by most individuals. Present principles describe leveraging this otherwise unused bandwidth for additional assets (such as additional game audio channels or haptics) that can be used to drive additional speaker channels or haptics.

Accordingly, an apparatus includes at least one processor configured to identify at least one computer simulation asset (CSA) associated with at least one computer simulation and shift at least one frequency of the CSA up to at least one ultrasonic frequency bandwidth. The processor is configured to mix the CSA with audio associated with the computer simulation, and transmit the CSA with audio associated with the computer simulation for presentation by at least one receiver assembly.

The CSA may include an audio asset, or a haptic asset, or even a scent or taste or video asset from the simulation.

In examples, the processor can be configured to compand frequencies of the at least one CSA prior to transmitting the at least one CSA.

In some implementations the CSA is a first CSA, and the processor is configured to identify at least a second CSA, shift the at least one frequency of the first CSA up to at least a first ultrasonic frequency bandwidth, shift at least one frequency of the second CSA up to at least a second ultrasonic frequency bandwidth, and mix the first and second CSAs with the audio associated with the computer simulation prior to transmitting the CSAs and audio associated with the computer simulation.

The at least one ultrasonic frequency bandwidth may include at least one bandwidth in the range 12-24 kHz.

In another aspect, a device includes at least one computer storage that is not a transitory signal and that in turn includes instructions executable by at least one processor to receive at least one computer simulation asset (CSA) associated with at least one computer simulation. The CSA is mixed with audio associated with the computer simulation. The instructions are executable to extract the audio associated with the computer simulation and play the audio associated with the computer simulation on at least one speaker. The instructions further are executable to downshift at least one frequency of the CSA and present the CSA on at least one output device after downshifting the at least one frequency of the CSA.

The CSA can be an audio asset and the output device can be a speaker. The CSA can be a haptic asset and the output device can be a haptic generator.

The instructions may be executable to expand frequencies of the at least one CSA prior to presenting the at least one CSA.

In some examples, the at least one CSA is a first CSA, and the instructions can be executable to receive at least a second CSA mixed with the audio associated with the computer simulation, downshift the at least one frequency of the first CSA from at least a first ultrasonic frequency bandwidth, downshift at least one frequency of the second CSA from at least a second ultrasonic frequency bandwidth, and present the first and second CSAs.

In another aspect, a method includes mixing audio associated with at least one computer simulation with ultrasonic frequencies representing at least a first computer simulation asset (CSA) associated with the at least one computer simulation. The method includes transmitting the audio and the first CSA, receiving the audio and first CSA. and playing the audio on at least one speaker. The method further includes downshifting the ultrasonic frequencies and presenting the first CSA on at least one output device after downshifting.

The details of the present application, both as to its structure and operation, can be best understood in reference to the accompanying drawings, in which like reference numerals refer to like parts, and in which:

DETAILED DESCRIPTION

Figure 1:
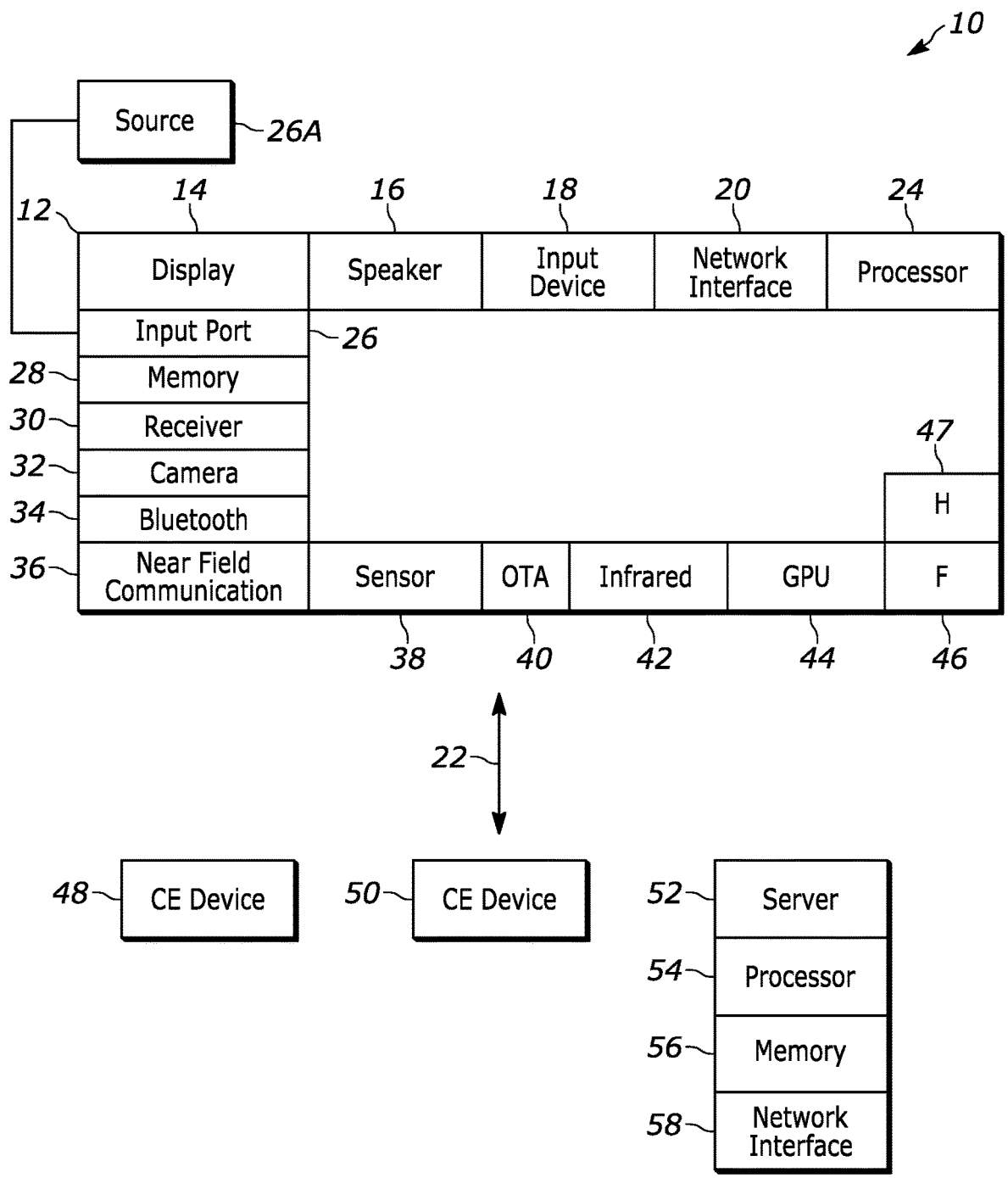
FIG. 1 is a block diagram of an example system in accordance with present principles.

This disclosure relates generally to computer ecosystems including aspects of consumer electronics (CE) device networks such as but not limited to computer game networks. A system herein may include server and client components which may be connected over a network such that data may be exchanged between the client and server components. The client components may include one or more computing devices including game consoles such as Sony PlayStation® or a game console made by Microsoft or Nintendo or other manufacturer, extended reality (XR) headsets such as virtual reality (VR) headsets, augmented reality (AR) headsets, portable televisions (e.g., smart TVs, Internet-enabled TVs), portable computers such as laptops and tablet computers, and other mobile devices including smart phones and additional examples discussed below. These client devices may operate with a variety of operating environments. For example, some of the client computers may employ, as examples, Linux operating systems, operating systems from Microsoft, or a Unix operating system, or operating systems produced by Apple, Inc., or Google, or a Berkeley Software Distribution or Berkeley Standard Distribution (BSD) OS including descendants of BSD. These operating environments may be used to execute one or more browsing programs, such as a browser made by Microsoft or Google or Mozilla or other browser program that can access websites hosted by the Internet servers discussed below. Also, an operating environment according to present principles may be used to execute one or more computer game programs.

Servers and/or gateways may be used that may include one or more processors executing instructions that configure the servers to receive and transmit data over a network such as the Internet. Or a client and server can be connected over a local intranet or a virtual private network. A server or controller may be instantiated by a game console such as a Sony PlayStation®, a personal computer, etc.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community such as an online social website or gamer network to network members.

A processor may be a single- or multi-chip processor that can execute logic by means of various lines such as address lines, data lines, and control lines and registers and shift registers. A processor including a digital signal processor (DSP) may be an embodiment of circuitry.

Components included in one embodiment can be used in other embodiments in any appropriate combination. For example, any of the various components described herein and/or depicted in the Figures may be combined, interchanged, or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together.

Referring now to FIG. 1, an example system 10 is shown, which may include one or more of the example devices mentioned above and described further below in accordance with present principles. The first of the example devices included in the system 10 is a consumer electronics (CE) device such as an audio video device (AVD) 12 such as but not limited to a theater display system which may be projector-based, or an Internet-enabled TV with a TV tuner (equivalently, set top box controlling a TV). The AVD 12 alternatively may also be a computerized Internet enabled ("smart") telephone, a tablet computer, a notebook computer, a head-mounted device (HMD) and/or headset such as smart glasses or a VR headset, another wearable computerized device, a computerized Internet-enabled music player, computerized Internet-enabled headphones, a computerized Internet-enabled implantable device such as an implantable skin device, etc. Regardless, it is to be understood that the AVD 12 is configured to undertake present principles (e.g., communicate with other CE devices to undertake present principles, execute the logic described herein, and perform any other functions and/or operations described herein).

Accordingly, to undertake such principles the AVD 12 can be established by some, or all of the components shown. For example, the AVD 12 can include one or more touch-enabled displays 14 that may be implemented by a high definition or ultra-high definition "4K" or higher flat screen. The touch-enabled display(s) 14 may include, for example, a capacitive or resistive touch sensing layer with a grid of electrodes for touch sensing consistent with present principles.

The AVD 12 may also include one or more speakers 16 for outputting audio in accordance with present principles, and at least one additional input device 18 such as an audio receiver/microphone for entering audible commands to the AVD 12 to control the AVD 12. The example AVD 12 may also include one or more network interfaces 20 for communication over at least one network 22 such as the Internet, an WAN, an LAN, etc. under control of one or more processors 24. Thus, the interface 20 may be, without limitation, a Wi-Fi transceiver, which is an example of a wireless computer network interface, such as but not limited to a mesh network transceiver. It is to be understood that the processor 24 controls the AVD 12 to undertake present principles, including the other elements of the AVD 12 described herein such as controlling the display 14 to present images thereon and receiving input therefrom. Furthermore, note the network interface 20 may be a wired or wireless modem or router, or other appropriate interface such as a wireless telephony transceiver, or Wi-Fi transceiver as mentioned above, etc.

In addition to the foregoing, the AVD 12 may also include one or more input and/or output ports 26 such as a high-definition multimedia interface (HDMI) port or a universal serial bus (USB) port to physically connect to another CE device and/or a headphone port to connect headphones to the AVD 12 for presentation of audio from the AVD 12 to a user through the headphones. For example, the input port 26 may be connected via wire or wirelessly to a cable or satellite source 26a of audio video content. Thus, the source 26a may be a separate or integrated set top box, or a satellite receiver. Or the source 26a may be a game console or disk player containing content. The source 26a when implemented as a game console may include some or all of the components described below in relation to the CE device 48.

The AVD 12 may further include one or more computer memories/computer-readable storage media 28 such as disk-based or solid-state storage that are not transitory signals, in some cases embodied in the chassis of the AVD as stand-alone devices or as a personal video recording device (PVR) or video disk player either internal or external to the chassis of the AVD for playing back AV programs or as removable memory media or the below-described server. Also, in some embodiments, the AVD 12 can include a position or location receiver such as but not limited to a cellphone receiver, GPS receiver and/or altimeter 30 that is configured to receive geographic position information from a satellite or cellphone base station and provide the information to the processor 24 and/or determine an altitude at which the AVD 12 is disposed in conjunction with the processor 24.

Continuing the description of the AVD 12, in some embodiments the AVD 12 may include one or more cameras 32 that may be a thermal imaging camera, a digital camera such as a webcam, an IR sensor, an event-based sensor, and/or a camera integrated into the AVD 12 and controllable by the processor 24 to gather pictures/images and/or video in accordance with present principles. Also included on the AVD 12 may be a Bluetooth® transceiver 34 and other Near Field Communication (NFC) element 36 for communication with other devices using Bluetooth and/or NFC technology, respectively. An example NFC element can be a radio frequency identification (RFID) element.

Further still, the AVD 12 may include one or more auxiliary sensors 38 that provide input to the processor 24. For example, one or more of the auxiliary sensors 38 may include one or more pressure sensors forming a layer of the touch-enabled display 14 itself and may be, without limitation, piezoelectric pressure sensors, capacitive pressure sensors, piezoresistive strain gauges, optical pressure sensors, electromagnetic pressure sensors, etc. Other sensor examples include a pressure sensor, a motion sensor such as an accelerometer, gyroscope, cyclometer, or a magnetic sensor, an infrared (IR) sensor, an optical sensor, a speed and/or cadence sensor, an event-based sensor, a gesture sensor (e.g., for sensing gesture command). The sensor 38 thus may be implemented by one or more motion sensors, such as individual accelerometers, gyroscopes, and magnetometers and/or an inertial measurement unit (IMU) that typically includes a combination of accelerometers, gyroscopes, and magnetometers to determine the location and orientation of the AVD 12 in three dimension or by an event-based sensors such as event detection sensors (EDS). An EDS consistent with the present disclosure provides an output that indicates a change in light intensity sensed by at least one pixel of a light sensing array. For example, if the light sensed by a pixel is decreasing, the output of the EDS may be −1; if it is increasing, the output of the EDS may be a +1. No change in light intensity below a certain threshold may be indicated by an output binary signal of 0.

The AVD 12 may also include an over-the-air TV broadcast port 40 for receiving OTA TV broadcasts providing input to the processor 24. In addition to the foregoing, it is noted that the AVD 12 may also include an infrared (IR) transmitter and/or IR receiver and/or IR transceiver 42 such as an IR data association (IRDA) device. A battery (not shown) may be provided for powering the AVD 12, as may be a kinetic energy harvester that may turn kinetic energy into power to charge the battery and/or power the AVD 12. A graphics processing unit (GPU) 44 and field programmable gated array 46 also may be included. One or more haptics/vibration generators 47 may be provided for generating tactile signals that can be sensed by a person holding or in contact with the device. The haptics generators 47 may thus vibrate all or part of the AVD 12 using an electric motor connected to an off-center and/or off-balanced weight via the motor's rotatable shaft so that the shaft may rotate under control of the motor (which in turn may be controlled by a processor such as the processor 24) to create vibration of various frequencies and/or amplitudes as well as force simulations in various directions.

A light source such as a projector such as an infrared (IR) projector also may be included.

In addition to the AVD 12, the system 10 may include one or more other CE device types. In one example, a first CE device 48 may be a computer game console that can be used to send computer game audio and video to the AVD 12 via commands sent directly to the AVD 12 and/or through the below-described server while a second CE device 50 may include similar components as the first CE device 48. In the example shown, the second CE device 50 may be configured as a computer game controller manipulated by a player or a head-mounted display (HMD) worn by a player. The HMD may include a heads-up transparent or non-transparent display for respectively presenting AR/MR content or VR content (more generally, extended reality (XR) content). The HMD may be configured as a glasses-type display or as a bulkier VR-type display vended by computer game equipment manufacturers.

In the example shown, only two CE devices are shown, it being understood that fewer or greater devices may be used. A device herein may implement some or all of the components shown for the AVD 12. Any of the components shown in the following figures may incorporate some or all of the components shown in the case of the AVD 12.

Now in reference to the afore-mentioned at least one server 52, it includes at least one server processor 54, at least one tangible computer readable storage medium 56 such as disk-based or solid-state storage, and at least one network interface 58 that, under control of the server processor 54, allows for communication with the other illustrated devices over the network 22, and indeed may facilitate communication between servers and client devices in accordance with present principles. Note that the network interface 58 may be, e.g., a wired or wireless modem or router, Wi-Fi transceiver, or other appropriate interface such as, e.g., a wireless telephony transceiver.

Accordingly, in some embodiments the server 52 may be an Internet server or an entire server "farm" and may include and perform "cloud" functions such that the devices of the system 10 may access a "cloud" environment via the server 52 in example embodiments for, e.g., network gaming applications. Or the server 52 may be implemented by one or more game consoles or other computers in the same room as the other devices shown or nearby.

The components shown in the following figures may include some or all components shown in herein. Any user interfaces (UI) described herein may be consolidated and/or expanded, and UI elements may be mixed and matched between UIs.

Present principles may employ various machine learning models, including deep learning models. Machine learning models consistent with present principles may use various algorithms trained in ways that include supervised learning, unsupervised learning, semi-supervised learning, reinforcement learning, feature learning, self-learning, and other forms of learning. Examples of such algorithms, which can be implemented by computer circuitry, include one or more neural networks, such as a convolutional neural network (CNN), a recurrent neural network (RNN), and a type of RNN known as a long short-term memory (LSTM) network. Support vector machines (SVM) and Bayesian networks also may be considered to be examples of machine learning models. In addition to the types of networks set forth above, models herein may be implemented by classifiers.

As understood herein, performing machine learning may therefore involve accessing and then training a model on training data to enable the model to process further data to make inferences. An artificial neural network/artificial intelligence model trained through machine learning may thus include an input layer, an output layer, and multiple hidden layers in between that that are configured and weighted to make inferences about an appropriate output.

Figure 2:
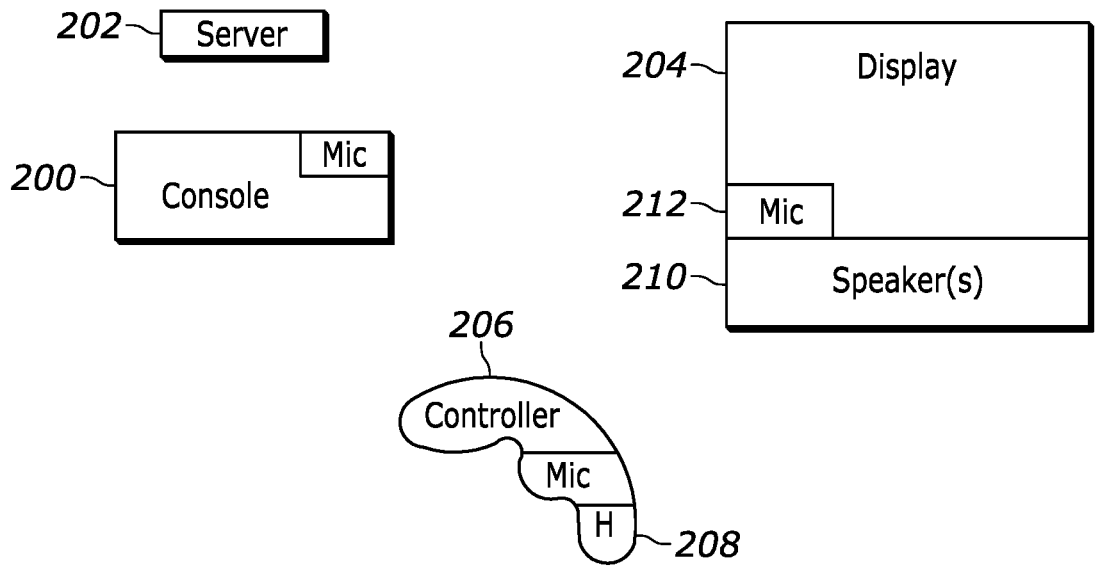
FIG. 2 illustrates an example specific system consistent with present principles.

Refer now to FIG. 2. A computer simulation such as a computer game may be sent from a computer game console 200 or a computer game server 202 to a display device 204 such as a TV for presentation of the computer simulation under control of one or more computer simulation controllers 206, such as but not limited to a PlayStation® controller or other controller.

One or more haptic generators 208 may be provided on the controller 206, which can be operated by a player to control presentation of the computer simulation. Audio sourced from the game console 200 or server 202 is played on one or more speakers 210 of a speaker system. The elements of the system shown in FIG. 2 can incorporate some or all of the appropriate devices and components described above in reference to FIG. 1. One or more of the components in FIG. 2 may include one or more microphones 212.

Figure 3:
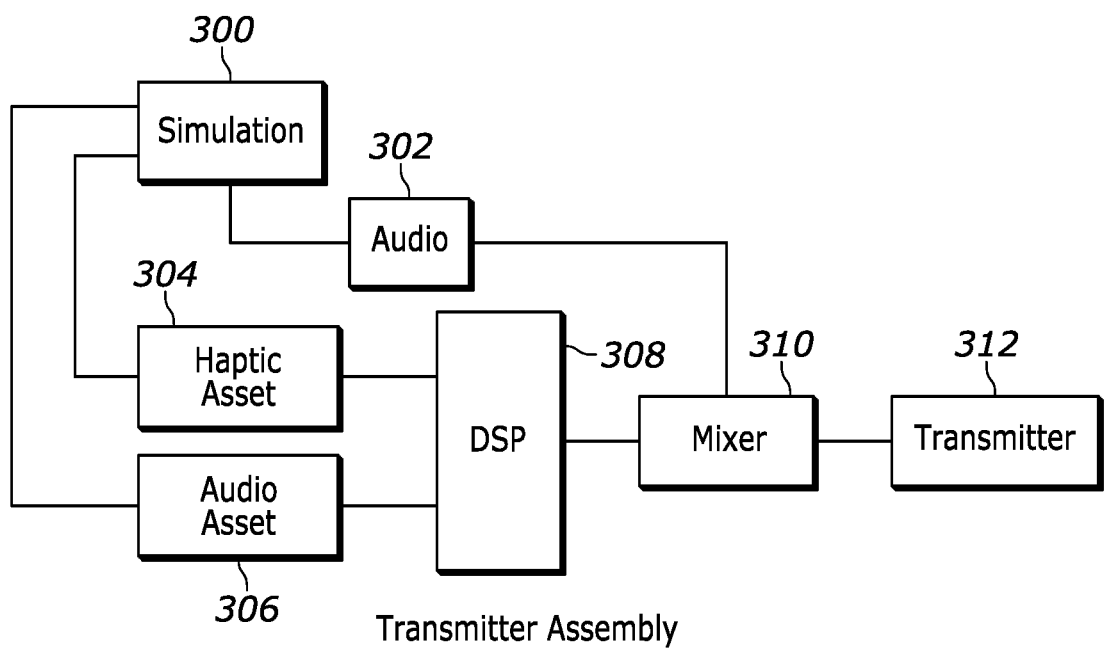
FIG. 3 illustrates an example transmitter assembly consistent with present principles.

Aspects of an example transmitter assembly are shown in FIG. 3. The transmitter assembly may be part of, e.g., a server, a game console, or any other appropriate component discussed herein.

A computer simulation 300 such as a computer game provides simulation audio 302 in the audible frequency range, typically under 12 Khz, and one or more computer game assets (CGA for short) such as one or more haptic assets 304 and one or more audio assets 306. Audio assets may be computer objects that represent acoustic effects such as special effects, for example, that are tied to the game while haptic assets typically are objects that represent haptic effects tied to the game.

As shown in FIG. 3, the assets 304, 306 are provided to a processor such as a DSP 308 for operations set forth further herein, with the operated-on assets output by the DSP 308 being mixed or summed with the game audio 302 in a mixer 310. The output of the mixer 310 is sent to a transmitter 312 for wired and/or wireless transmission to a receiver assembly that typically is part of a player component. Although shown as being a component separate from the DSP 308, the mixer 310 may be implemented by the DSP 308 in some embodiments.

Figure 4:
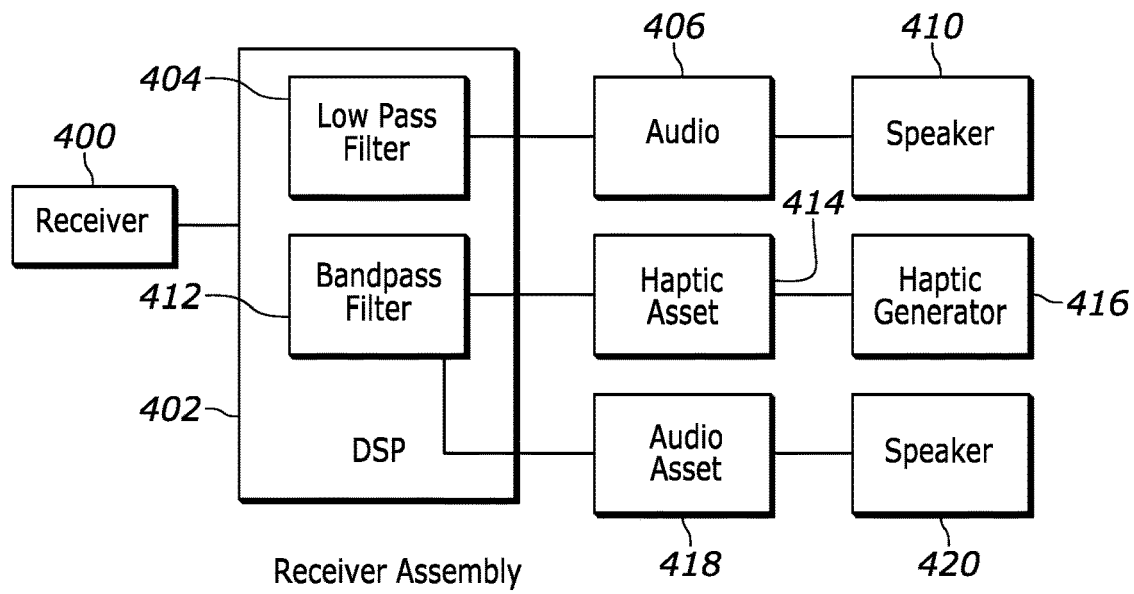
FIG. 4 illustrates an example receiver assembly consistent with present principles.

FIG. 4 illustrates an example of such a receiver assembly, which may be implemented by any suitable device herein. A receiver 400 receives the signals from the transmitter 312. The receiver 400 passes the signal to a receiver DSP 402, which may access or implement one or more low pass filters 404 to output the audio 302 portion of the signal (shown as audio 406 in FIG. 4) for play of the audio on one or more speakers 410.

The DSP 402 also accesses or includes one or more bandpass filters 412 to process the portions of the signal from the transmitter 312 representing the CGAs 304, 306, labeled 414, 416, respectively in FIG. 4. Haptic assets 414 are presented on one or more haptic generators 416 such as any of the haptic generators described herein, while audio assets 416 are played on one or more speakers 420.

Figure 5:
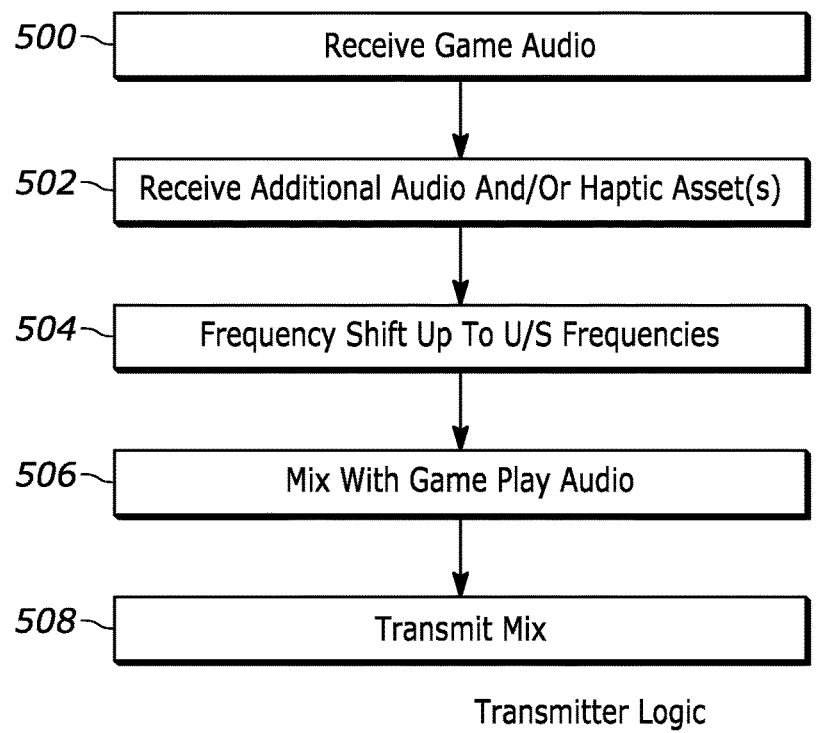
FIG. 5 illustrates a first example transmitter logic in example flow chart format.
Figure 6:
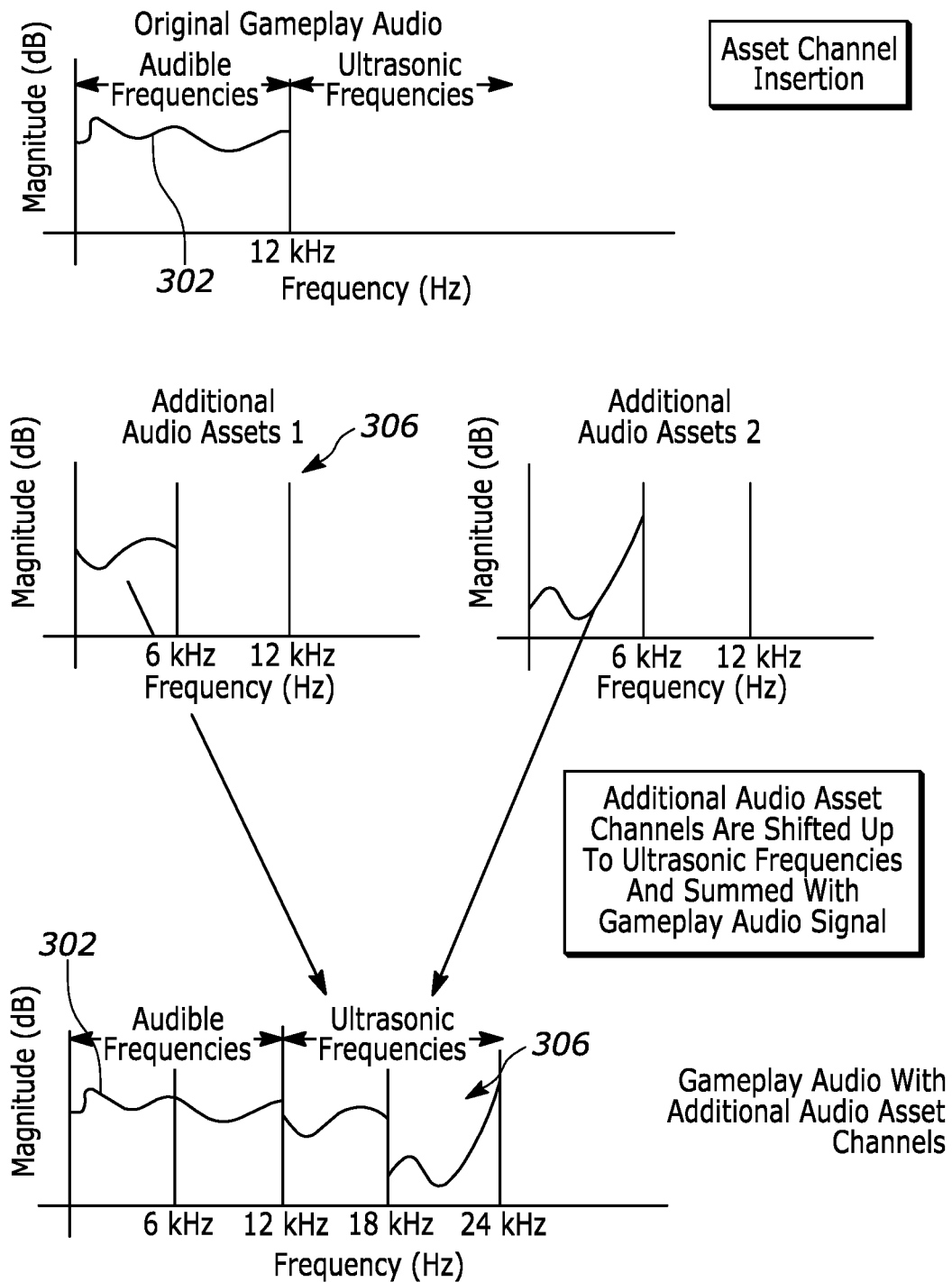
FIG. 6 illustrates signal processing consistent with FIG. 5.

FIG. 5 illustrates a first embodiment of logic that may be executed by the transmitter shown in FIG. 3, while FIG. 6 illustrates accompanying signal waveforms related to the logic of FIG. 5. Commencing at block 500, the game audio 302 is received from the simulation 300. The additional CGAs 304, 306 are received at block 502.

Moving to block 504, the frequencies of the signals representing the CGAs are shifted into the ultrasonic range. Typically, this requires shifting the frequencies up. In one example, the ultrasonic range is approximately 12 Khz-24 Khz, plus or minus five percent, or plus or minus 10 percent, or plus or minus 20 percent.

Proceeding to the block 506, the up-shifted (in frequency) CGAs are mixed with the game audio received at block 500. Proceeding to block 508, the resulting superposition of waveforms is transmitted to the output device that employs the receiver assembly of FIG. 4.

When multiple CGAs are to be mixed with the game audio 302, the ultrasonic frequencies can be subdivided into smaller bands, each representing an asset channel. For example, if two CGAs are to be transmitted, the first CGA can have its frequencies shifted to a 12 KHz-18 Khz band and the second CGA can have its frequencies shifted to an 18 KHz-24 Khz band.

FIG. 6 illustrates, in the top panel, the game audio 302 in the audible frequency range below the ultrasonic frequency range, while the middle panel illustrates plural audio assets 306 originally having frequencies in the audible range (0 KHz-12 Khz for instance) being shifted in the bottom panel of FIG. 6 into respective bands in the ultrasonic range and mixed with the game audio 302 in the audible range.

Figure 7:
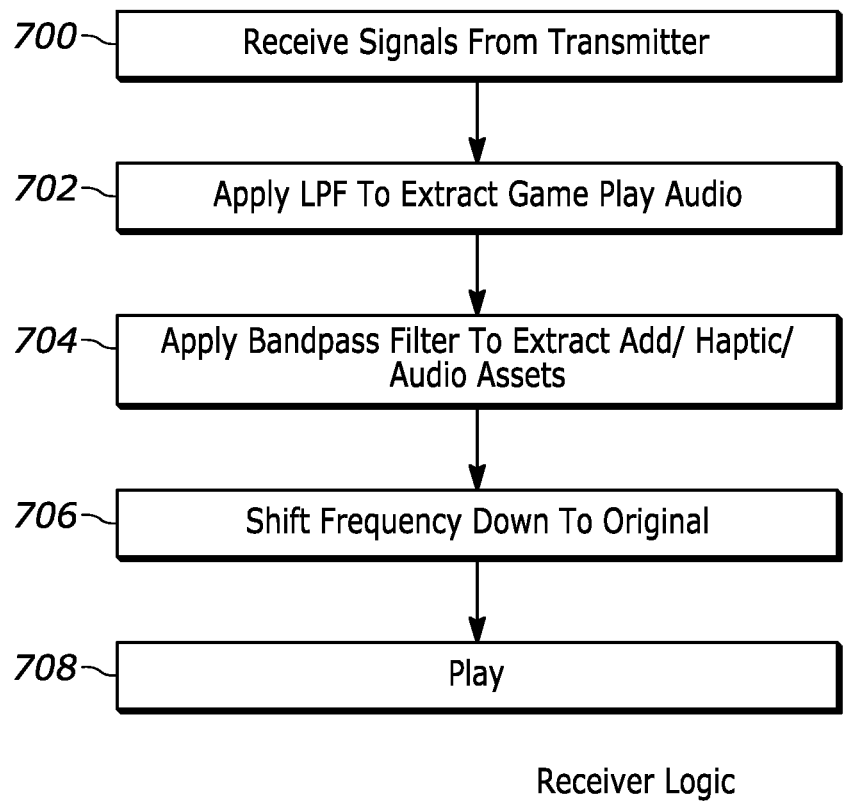
FIG. 7 illustrates a first example receiver logic in example flow chart format.

FIG. 7 illustrates a first embodiment of example logic that may be executed by the receiver assembly of FIG. 4. Signals from the transmitter assembly shown in FIG. 3 are received at block 700 via wireless and/or wired paths. Moving to block 702, the LPF 404 is used by the DSP 402 to extract the game play audio 302 in the audible portion of the signal received from the transmitter. Proceeding to block 704, the bandpass filter 412 is used by the DSP 402 to extract the CGAs from the ultrasonic portion of the signal received from the transmitter, and the frequencies of the extracted CGAs are shifted down at block 706 to their original audible range as sources from the simulation 300. The CGAs in their original frequencies are played at block 708, either by one or more haptic generators in the case of haptic assets 304 or one or more speakers in the case of audio assets 306.

Figure 8:
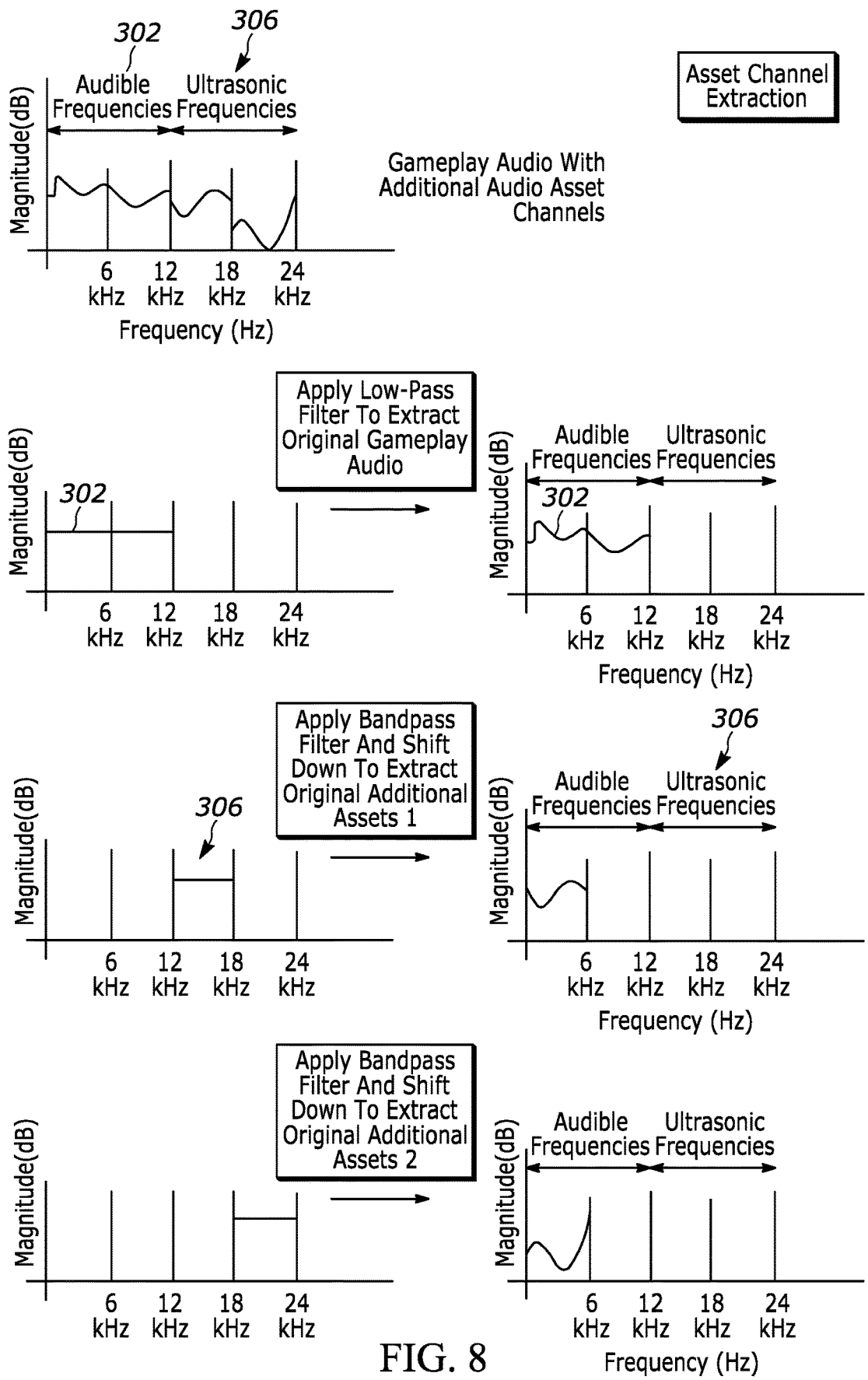
FIG. 8 illustrates signal processing consistent with FIG. 6.

FIG. 8 illustrates in the top panel the game play audio 302 being received in the audible range and the CGAs 306 being received in the ultrasonic range of the signal received from the transmitter assembly. The second panel illustrates use of the LPF 404 to separate the game play audio from the audible portion of the signal while the third panel of FIG. 8 illustrates use of the bandpass filter 412 to separate out the ultrasonic version of the first CGA from a first portion of the ultrasonic band. The bottom panel of FIG. 8 illustrates use of the bandpass filter 412 to separate out the ultrasonic version of the second CGA from a second portion of the ultrasonic band.

Figure 9:
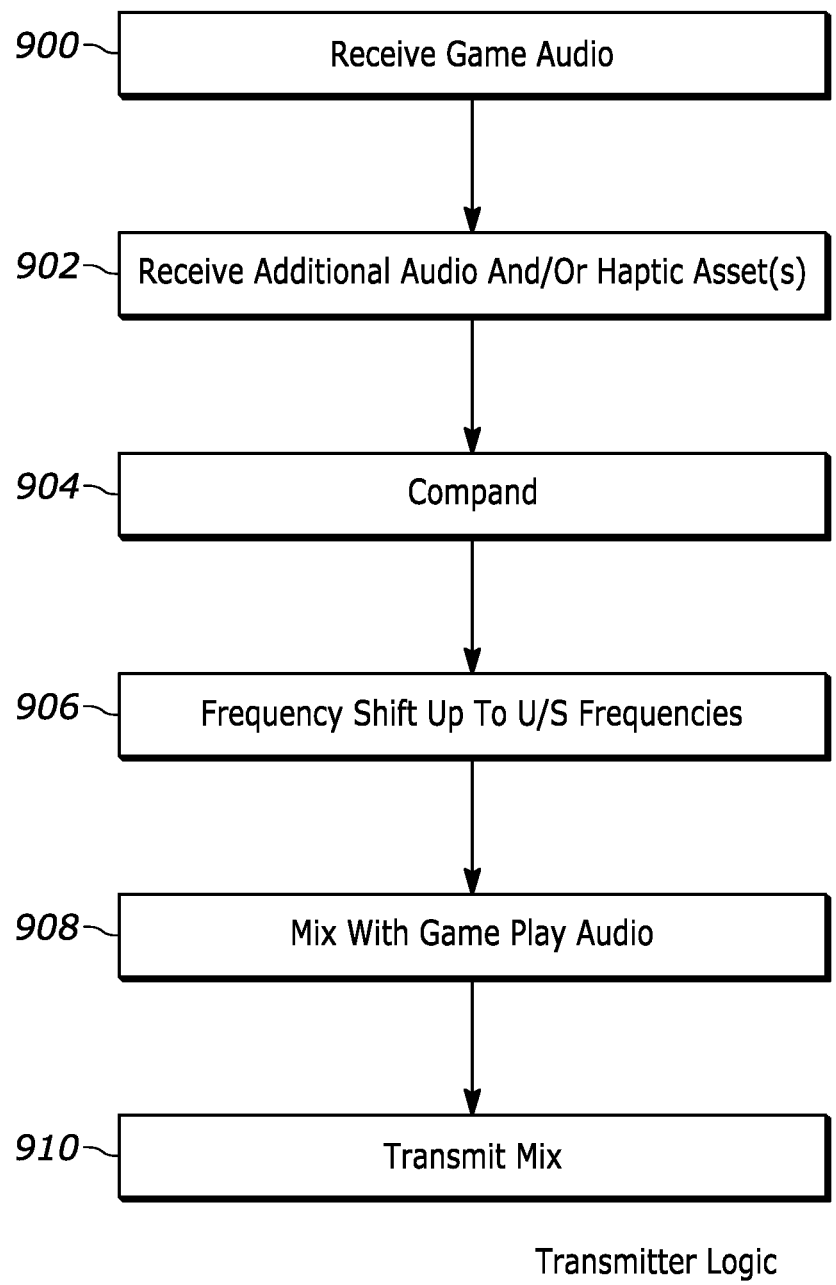
FIG. 9 illustrates a second example transmitter logic in example flow chart format.
Figure 10:
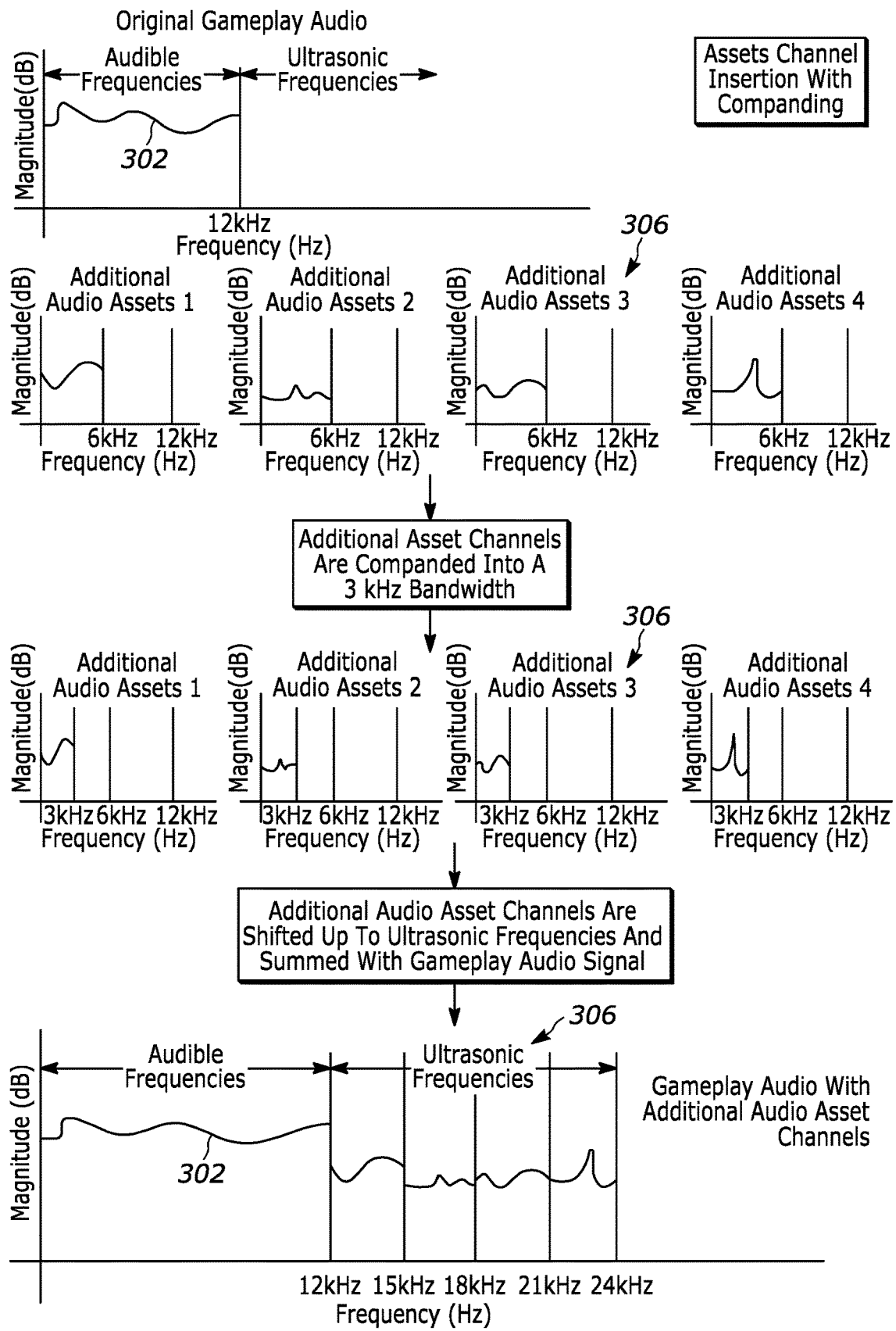
FIG. 10 illustrates signal processing consistent with FIG. 9.

FIG. 9 illustrates a second embodiment of logic that may be executed by the transmitter shown in FIG. 3, while FIG. 10 illustrates accompanying signal waveforms related to the logic of FIG. 9. Commencing at block 900, the game audio 302 is received from the simulation 300. The additional CGAs 304, 306 are received at block 902.

Proceeding to block 904, each ultrasonic asset channel can be companded, a process in which its full bandwidth is compressed into the bandwidth of the subdivided ultrasonic segment range.

Moving to block 906, the frequencies of the signals representing the CGAs are shifted into the ultrasonic range. Typically, this requires shifting the frequencies up. When multiple CGAs are to be mixed with the game audio 302, the ultrasonic frequencies are shifted into their respective companded channels. For example, one companded channel may be the 12 Khz-14 Khz range, a second companded channel may be the 14 Khz-16 Khz range, a third companded channel may be the 16 Khz-18 Khz range, and so on. Note that the companded channels need not have the same bandwidth as each other. Note that the companded channels may have identical bandwidths other than 2 Khz, e.g., each companded channel may have a bandwidth of three Khz. In general, the ultrasonic frequency band is divided into companded channels the number of which equal or closely approximate the number of CGAs to be transmitted.

Proceeding to the block 908, the up-shifted (in frequency) CGAs are mixed with the game audio received at block 900.

Proceeding to block 910, the resulting superposition of waveforms is transmitted to the output device that employs the receiver assembly of FIG. 4.

FIG. 10 illustrates, in the top panel, the game audio 302 in the audible frequency range below the ultrasonic frequency range, while the second panel illustrates four audio assets 306 originally having frequencies in the audible range (0 KHz-12 Khz for instance) being assigned to respective frequency bands that are companded as shown in the third panel. The bottom panel in FIG. 10 illustrates the companded channels being shifted into their respective companded channels in the ultrasonic range.

Figure 11:
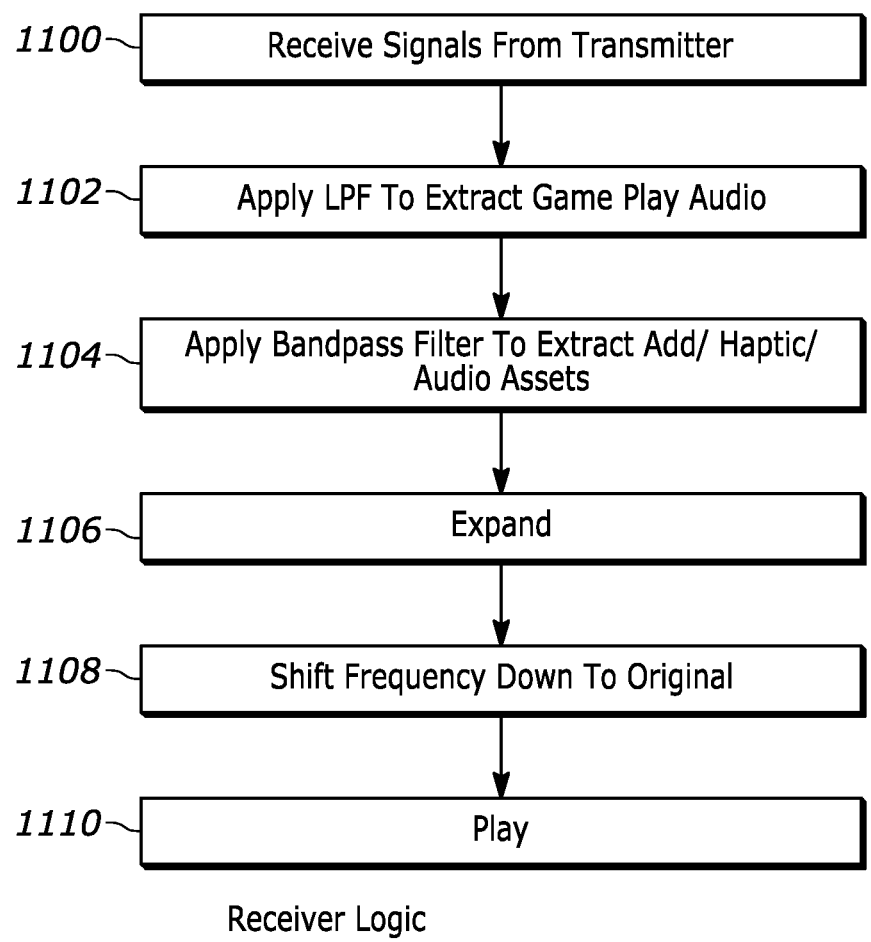
FIG. 11 illustrates a second example receiver logic in example flow chart format.

FIG. 11 illustrates a second embodiment of example logic that may be executed by the receiver assembly of FIG. 4. Signals from the transmitter assembly shown in FIG. 3 are received at block 1100 via wireless and/or wired paths. Moving to block 1102, the LPF 404 is used by the DSP 402 to extract the game play audio 302 in the audible portion of the signal received from the transmitter. Proceeding to block 1104, the bandpass filter 412 is used by the DSP 402 to extract the CGAs from the ultrasonic portion of the signal received from the transmitter.

Flowing to block 1106, the frequencies in the ultrasonic range representing the extracted CGAs are expanded to their full bandwidth. At block 1108, the expanded channels are shifted down to their original audible range as sources from the simulation 300. The CGAs in their original frequencies are played at block 1110, either by one or more haptic generators in the case of haptic assets 304 or one or more speakers in the case of audio assets 306.

Figure 12:
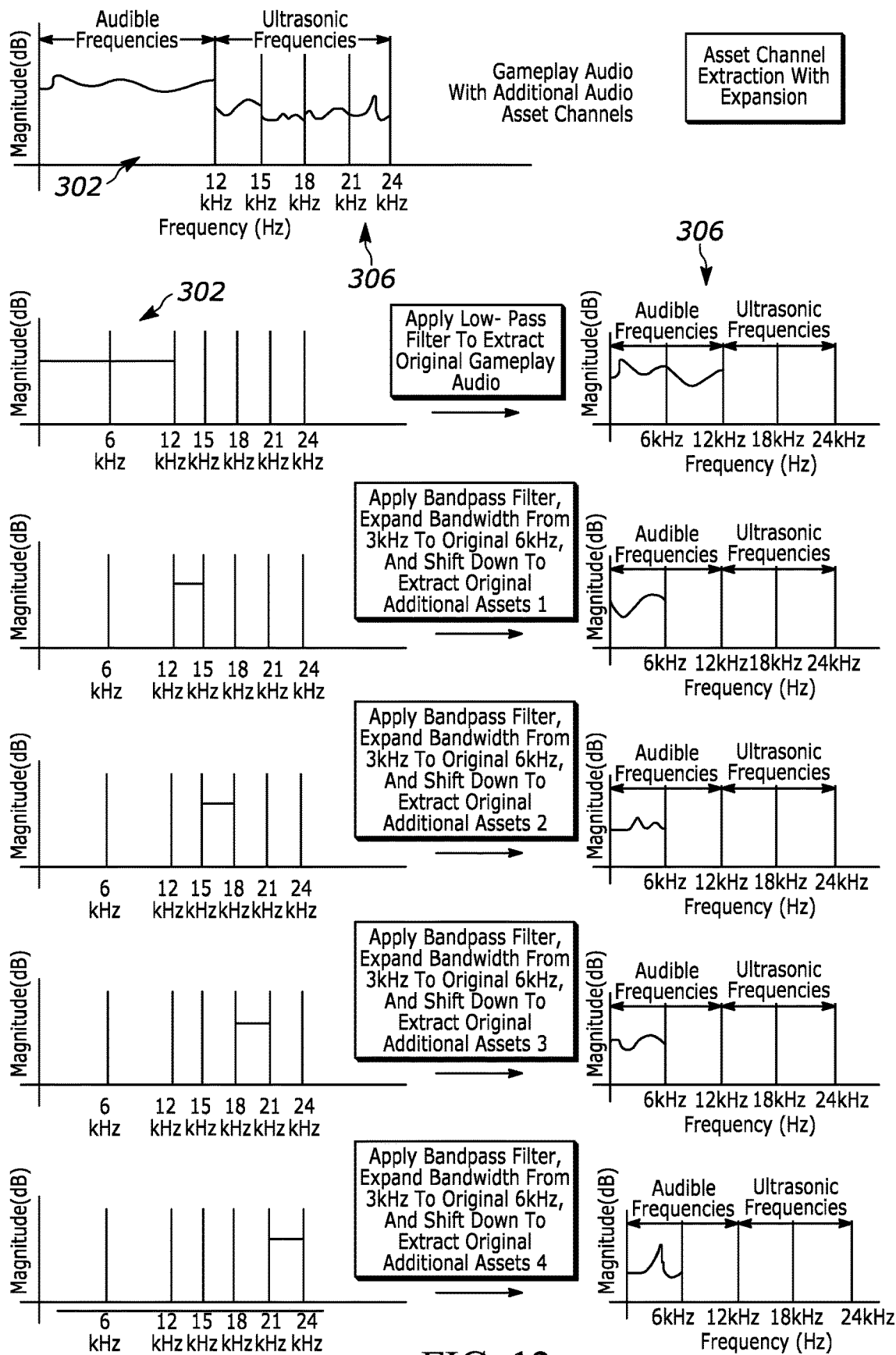
FIG. 12 illustrates signal processing consistent with FIG. 11.

FIG. 12 illustrates in the top panel the game play audio 302 being received in the audible range and the CGAs 306 being received in the ultrasonic range of the signal received from the transmitter assembly. The second panel illustrates use of the LPF 404 to separate the game play audio from the audible portion of the signal while the third through sixth panels of FIG. 12 illustrate, respectively, use of the bandpass filter 412 to separate out the ultrasonic versions of the respective CGAs from the respective portions of the ultrasonic band, expanding the channels and shifting them down to their original frequencies for play thereof.

Thus, on the output device, the DSP applies multiple ultrasonic bandpass filters to extract each asset channel, expanded to recover the original bandwidth size, and frequency shift to the original audible frequency range.

Present principles can be applied to reduce a multiple wireless audio channel bandwidth requirement to support the game and haptic audio on a computer game controller such as a DualSense controller. Haptic audio channels may instead be frequency-shifted to the ultrasonic range and mixed with regular game audio and transmitted on the game audio wireless channel, then extracted and shifted back to the original audio frequencies once received on the controller. This makes available and frees up wireless bandwidth for other uses or for use with new peripheral devices for the computer game console.

While the particular embodiments are herein shown and described in detail, it is to be understood that the subject matter which is encompassed by the present invention is limited only by the claims.

What is claimed is:

1. An apparatus comprising:
at least one processor configured to:
identify at least one computer simulation asset (CSA) associated with at least one computer simulation;
shift at least one frequency of the CSA up to at least one ultrasonic frequency bandwidth;
mix the CSA with audio associated with the computer simulation; and
transmit the CSA with audio associated with the computer simulation for presentation by at least one receiver assembly.

2. The apparatus of claim 1, wherein the at least one CSA comprises an audio asset.

3. The apparatus of claim 1, wherein the at least one CSA comprises a haptic asset.

4. The apparatus of claim 1, wherein the processor is configured to:
compand frequencies of the at least one CSA prior to transmitting the at least one CSA.

5. The apparatus of claim 1, wherein the at least one CSA comprises a first CSA and the processor is configured to:
identify at least a second CSA;
shift the at least one frequency of the first CSA up to at least a first ultrasonic frequency bandwidth;
shift at least one frequency of the second CSA up to at least a second ultrasonic frequency bandwidth; and
mix the first and second CSAs with the audio associated with the computer simulation prior to transmitting the CSAs and audio associated with the computer simulation.

6. The apparatus of claim 1, wherein the at least one ultrasonic frequency bandwidth comprises at least one bandwidth in the range 12-24 kHz.

7. A device comprising:
at least one computer storage that is not a transitory signal and that comprises instructions executable by at least one processor to:
receive at least one computer simulation asset (CSA) associated with at least one computer simulation, the at least one CSA being mixed with audio associated with the computer simulation;
extract the audio associated with the computer simulation;
play the audio associated with the computer simulation on at least one speaker;
downshift at least one frequency of the CSA; and
present the CSA on at least one output device after downshifting the at least one frequency of the CSA.

8. The apparatus of claim 7, wherein the at least one CSA comprises an audio asset and the output device comprises at least one speaker.

9. The apparatus of claim 7, wherein the at least one CSA comprises a haptic asset and the output device comprises at least one haptic generator.

10. The apparatus of claim 7, wherein the instructions are executable to:
expand frequencies of the at least one CSA prior to presenting the at least one CSA.

11. The apparatus of claim 7, wherein the at least one CSA comprises a first CSA and the instructions are executable to:
receive at least a second CSA mixed with the audio associated with the computer simulation;
downshift the at least one frequency of the first CSA from at least a first ultrasonic frequency bandwidth;
downshift at least one frequency of the second CSA from at least a second ultrasonic frequency bandwidth; and
present the first and second CSAs.

12. The apparatus of claim 7, wherein the at least one frequency of the CSA comprises at least one bandwidth in the range 12-24 kHz.

13. The device of claim 12, comprising the at least one processor.

14. A method, comprising:
mixing audio associated with at least one computer simulation with ultrasonic frequencies representing at least a first computer simulation asset (CSA) associated with the at least one computer simulation;
transmitting the audio and the first CSA;
receiving the audio and first CSA;
playing the audio on at least one speaker;
downshifting the ultrasonic frequencies; and
presenting the first CSA on at least one output device after downshifting.

15. The method of claim 14, wherein the first CSA comprises an audio asset and the output device comprises at least one speaker.

16. The method of claim 14, wherein the first CSA comprises a haptic asset and the output device comprises at least one haptic generator.

17. The method of claim 14, comprising:
companding frequencies associated with the first CSA.

18. The method of claim 14, comprising:
expanding frequencies of the first CSA prior to presenting the first CSA.

19. The method of claim 14, comprising:
receiving at least a second CSA mixed with the audio associated with the computer simulation;
downshifting the ultrasonic frequencies of the first CSA from at least a first ultrasonic frequency bandwidth;
downshifting at least one frequency of the second CSA from at least a second ultrasonic frequency bandwidth; and
presenting the first and second CSAs.

20. The method of claim 14, wherein the ultrasonic frequencies comprise at least one bandwidth in the range 12-24 kHz.

* * * * *